United States Patent [19]

Ueda et al.

[11] Patent Number: 5,254,437
[45] Date of Patent: Oct. 19, 1993

[54] PHOTOSENSITIVE RESIN COMPOSITION FOR FLEXOGRAPHIC PRINTING

[75] Inventors: Koichi Ueda, Neyagawa; Katsuji Konishi, Ibaraki; Kazunori Kanda, Yao, all of Japan

[73] Assignee: Nippon Paint Co., Ltd., Osaka, Japan

[21] Appl. No.: 15,049

[22] Filed: Feb. 8, 1993

Related U.S. Application Data

[63] Continuation of Ser. No. 716,979, Jun. 18, 1991, abandoned.

[30] Foreign Application Priority Data

Jun. 18, 1990 [JP] Japan .................................. 2-158960

[51] Int. Cl.$^5$ ............................................. G03C 1/492
[52] U.S. Cl. ..................... 430/273; 430/917; 430/918; 430/950
[58] Field of Search ................ 430/273, 950, 918, 917

[56] References Cited

U.S. PATENT DOCUMENTS

| | | | |
|---|---|---|---|
| 4,126,460 | 11/1978 | Okishi | 430/950 X |
| 4,842,982 | 6/1989 | Seibel et al. | 430/273 X |

FOREIGN PATENT DOCUMENTS

| | | | |
|---|---|---|---|
| 0068599 | 1/1983 | European Pat. Off. | |
| 0260943 | 3/1988 | European Pat. Off. | 430/950 |
| 0335399 | 10/1989 | European Pat. Off. | |
| 0403096 | 12/1990 | European Pat. Off. | |
| 52-64924 | 5/1977 | Japan | 430/273 |
| 59-211044 | 11/1984 | Japan | 430/273 |
| 2024441 | 1/1980 | United Kingdom | |

OTHER PUBLICATIONS

No. 18056, "A light-sensitive material having a matting layer", *Research Disclosure*, Apr. 1979, pp. 160–161.

D. L. Flowers et al, "Lubrication and Pattern Improvement in Photolithography", *J. of the Electrochemical Society*, vol. 127, No. 7, 1980, pp. 1579–1582.

*Primary Examiner*—Marion E. Camish
*Assistant Examiner*—Mark A. Chapman
*Attorney, Agent, or Firm*—Wenderoth, Lind & Ponack

[57] ABSTRACT

Disclosed is a photosensitive resin plate which effectively prevents dot gain by covering the photosensitive resin layer with a specific matte layer. The photosensitive resin plate comprises a substrate, a photosensitive resin layer formed on the substrate and a resin matte layer formed on the photosensitive resin layer, wherein the resin matte layer contains a polymerization inhibiting material.

7 Claims, No Drawings

PHOTOSENSITIVE RESIN COMPOSITION FOR FLEXOGRAPHIC PRINTING

This application is a continuation of now abandoned application Ser. No. 07/716,979, filed Jun. 18, 1991 now abandoned.

FIELD OF THE INVENTION

The present invention relates to an improvement of a photosensitive resin composition which is used for flexographic printing.

BACKGROUND OF THE INVENTION

Flexographic printing is a method employing flexible reliefs made from rubber or a laminate of rubber and plastic and therefore has such good ink tranferability that it might be possible to print on a rough surface, such as on corrugated cardboards. However, since the reliefs are easily deformed by printing pressure, the thickening of printed images, so-called "dot gain", is liable to occur and thus it is difficult to obtain sharp and good printed images. Accordingly, it is considered that the flexographic printing is inferior to letter press printing or offset printing.

In order to reduce the dot gain, Japanese Kokai Publications 6392/1980 and 47966/1968 propose resin plates for flexographic printing, which provide dots which are difficult to be deformed by printing pressure. Japanese Kokai Publication 970/1990 also proposes a photosensitive resin plate for flexographic printing, which provides smaller relief than a negative image, thus making the relief image smaller than negative film images by the loss occurring when printed. The resin plates of the former patents have a structure comprising two layers which are different in hardness from each other, of which the upper layer to be contacted with paper has a higher hardness than that of the lower layer and the lower layer is softer as absorbing the printing pressure. In this method, however, a platemaking process is complicated because of the two layer construction of the photosensitive layer. In the latter patent's method, an air layer is provided between the negative film and the resin plate and an exposure is then conducted, whereby the oxygen in the air layer inhibits the polymerization reaction in some degree to result in obtaining a relief smaller than the negative image. The method, however, has drawbacks in that it is difficult to handle because the photosensitive resin is liquid and that the resulting dots are fragile.

SUMMARY OF THE INVENTION

The present invention provides a photosensitive resin plate which effectively prevents dot gain by covering the photosensitive resin layer with a specific matte layer. The photosensitive resin plate of the present invention comprises a substrate, a photosensitive resin layer formed on the substrate and a resin matte layer formed on the photosensitive resin layer, wherein the resin matte layer contains a polymerization inhibiting material.

DETAILED DESCRIPTION OF THE INVENTION

The resin matte layer is usually provided for preventing a negative film from sticking onto the resin plate and is mainly made of various kinds of resins, such as cellulose, polyvinyl alcohol, polyamide, polyacrylamide and the like. In addition to the main resin, the matte layer generally contains dyes (e.g. eosin, methylene blue, rose bengal, erythrosine and the like), inorganic particles (e.g. silica and the like), organic microparticles (e.g. microgels obtained by internally crosslinking styrene or acryl monomers), surfactants and distilled water and the like.

The matte layer generally has a thickness of 0.5 to 100 micron, preferably 1.0 to 10 micron. If the thickness is less than 0.5 micron, the effect of the matte layer is poor, thus resulting in a decline of the preventive effects of stickiness to the negative film and a decline of the photopolymerization inhibiting effects. If the thickness is more than 100 micron, the workability of the platemaking process is poor and the quality of the printed image is also poor.

According to the present invention, the resin matte layer further contains a polymerization inhibiting material (e.g. polymerization inhibitors, polymerization stoppers, chain transferring agents, polymerization regulators, antioxidants, ultraviolet absorbers and the like). The polymerization inhibiting material can be compatible or incompatible with the resin matte composition, but preferred is a material compatible with it. The material can also be compatible, partially compatible or incompatible with the photosensitive resin layer, and preferred is a material partially compatible with it. In other words, it is desired that most of the polymerization inhibiting materials are present in around the interface between the photosensitive resin layer and the matte layer. By the term "compatible" herein is meant that the polymerization inhibiting material is substantially completely dissolved in the host resins and by the term "incompatible" herein is meant that the photopolymerization inhibiting material is substantially, insoluble in the host resins. The term partially compatible in the context means either that the polymerization inhibiting material is impregnated in the photosensitive resin layer in a low concentration at the interface between the photosensitive resin layer and the matte layer, or that the polymerization inhibiting material is not dissolved but dispersed in them in the condition of domain constructions or separated layer constructions. It is preferred that the polymerization inhibiting material is one which does not transfer into the photosensitive resin layer with time and accumulates at the interface, thus selecting from the compounds which is partially compatible. The compatibility is varied depending not only upon molecular constructions, molecular weight, functional groups on the molecules, solubility parameters and the like, but also upon temperature, layer thickness, mixing ratio etc. when mixed. Typical examples of the radical polymerization inhibitors are hydroquinone, alkyl or aryl-substituted hydroquinones, 2,6-di-t-butyl-4-methylphenol, p-methoxyphenol, p-butylpyrocatechol, pyrogallol, β-naphthol, 2,6-di-t-butyl-p-cresol, phenothiazine, pyridine, nitrobenzene, dinitrobenzene, nitrosonaphthol, cupferrone and the like. Typical examples of the polymerization regulators and polymerization stoppers are dimethylxanthiogen disulfide, sodium dimethyldithiocarbamate, sodium diethyldithiocarbamate, sodium dibutyldithiocarbamate and the like. Typical examples of the chain transferring agents are thiol compounds (e.g. laurylmercaptane, dodecylmercaptane) and the like. Typical examples of the antioxidants are phenol antioxidants (e.g. phenol, cresol, β-naphthol, t-butylphenol, etc.); phosphate antioxidants (e.g. triphenylphosphine, triphenylphosphite, trilauryltrithiophosphite, hexamethylphospholylamide, diphenyldecylphosphite, dicresylphosphite, etc.); sulfur antioxidants (e.g. 2-mercaptobenzimidazole, dilauryl thiodipropionate, tetramethylthiuram monosulfide, zinc dibutyldithiocarbamate, etc.); amine antioxidants (e.g. aldol-α-naphthylamine, N,N'-diphenyl-p-phenylenediamine, 1-(2-hydroxyethyl)-2,2,4-trimethyldecahydroquinone, bis(2,2,6,6-tetramethyl-4-pyperidinyl) sebacate, etc.); the other antioxidants (e.g. [2,2'-thiobis(4-t-octylphenolate)]-n-butylamine nickel, cobalt dicyclohexyldithiophosphinate, etc.). Typical examples of the ultraviolet absorbers are benzophenones (e.g. 2-hydroxy-4-methoxybenzophenone, 2,4-dihydroxybenzophenone, 2,2'-hydroxy-4,4'-dimethoxybenzophenone, 2,4-dibenzoylresolcine, etc.); benzotriazoles (e.g. 2-(2'-hydroxy-5'-methylphenyl)benzotriazole, 2-(2'-hydroxy-3'-t-butyl-5'-methylphenyl)benzotriazole, etc.); phenyl benzoates (e.g. resolcine monobenzoate, etc.); phenyl salicylates (e.g. phenyl salicylate, 4-t-butylphenyl salicylate, etc.); the others low molecular weight UV absorbers (e.g. [2,2'-thiobis(4-t-octylphenolate)]-n-butylamine nickel(II), 2-ethylhexyl diphenylmethylenecyan acetate, etc.); polymeric UV absorbers (e.g. 2-hydroxy-4-(3-methacryloxy-2-hydroxypropoxy)benzophenone, 2,21-dihydroxy-4-(3-methacryloxypropoxy)benzophenone, 2,6-di-t-butyl-4-vinylphenol, 2-hydroxy-4-(vinylbenzyloxy)benzophenone, compounds described in UK Patent 898,065, U.S. Pat. Nos. 3,159,646, 3,141,903, 3,186,968, 2,883,361, 3,162,676, 3,173,893, 3,049,503, 3,107,199, 3,072,585 and Japanese Kokai Publication 56-125414, of which the English language patents are incorporated herein).

In the present invention, the effects of inhibiting polymerization reactions are preferably defined by two parameters, i.e. intrinsic inhibition index and with-time inhibition index. The inhibition index is calculated from the following equation;

Inhibition index = $(A - B)/A \times 100$ [wherein A = a dot diameter (micron) when the matte layer does not contain the polymerization inhibiting material, B = a dot diameter (micron) when the matte layer contains the polymerization inhibiting material.]

The sample plates are prepared by covering a resin plate composed of a substrate and a photosensitive resin layer thereon with a matte layer and leaving it for a certain number of days at 20° C., followed by exposing to light through a negative film having 65 lpi(line per inch) half tone and 10% circular dots and then developing. A is determined when the matte layer does not contain the polymerization inhibiting material and B is determined when the matte layer contains it, using a reflection-type microscope. In the present invention, the intrinsic inhibition index is defined as being determined after leaving for one day and the with-time inhibition index is defined as being determined after leaving for 7 days. According to the present invention, it is preferred that the intrinsic inhibition index is not less than 3, more preferably not less than 5, most preferably not less than 8. The with-time inhibition index is preferably not less than 3, more preferably not less than 5, most preferably not less than 8. Although the polymerization inhibition depends upon other conditions, such as compositions and properties of the photosensitive resin layer or the resin matte layer, it is more preferred in view of the inhibition index that the polymerization inhibiting materials are sodium dialkyldithiocarbamate, especially sodium diethyldithiocarbamate, sodium dipropyldithiocarbamate and sodium dibutyldithiocarbamate as polymerization inhibitors; cupferrone as polymerization stopper; β-naphthol, t-butylphenol, pentaerythrityltetrakis[3-(3,5-di-t-butyl-4-hydroxyphenyl) propionate], 2,2-thiodiethylenebis-[3-(3,5-di-t-butyl-4-hydroxyphenyl) propionate] as antioxidants.

The polymerization inhibiting material may be present in the matte layer in an amount of 0.1 to 70% by weight, preferably 0.3 to 55% by weight, based on the total amount of the matte layer. Amounts of less than 0.1% by weight have poor polymerization inhibition effects and increase dot gain. Amounts of more than 70% by weight provide poor relief because of poor hilight dots remaining properties, and reduce physical properties of dots.

The photosensitive resin layer of the present invention can be any of those known to the art and be water developable or organic solvent developable. Typical examples of the water developable photosensitive resin compositions are described in EP-A 164,270 and U.S. Pat. Nos. 4,952,481 and 4,957,850, which are herein incorporated. Typical examples of the organic solvent developable compositions are described in U.S. Pat. Nos. 4,323,637, 4,234,676 and 4,264,705 and Japanese Kokai Publication 52-64301, of which the English language patents are herein incorporated. A thickness of the photosensitive resin layer is generally within the range of 0.2 to 10.0 mm. It is preferred for flexographic printing that the photosensitive resin layer, when cured, has a Shore A hardness of 30° to 80° and an impact resilience of 20% or more.

The substrate for the resin plate can be any of those known to the art, for example metal plates, such as iron, stainless, copper, zinc and aluminum; rubber sheets, such as natural rubber or synthetic rubber; plastic sheets or films, such as celluloid, cellulose acetate, polyethylene, polypropylene, polyvinyl chloride, polymethyl methacrylate, polystyrene, polycarbonate, polyethylene tetephthalate and polyamide; and the like. The substrate generally has a thickness of 0.025 to 0.5 mm, preferably 0.05 to 0.4 and also is covered with a halation-preventing layer and an adhesive layer.

The photosensitive resin plate of the present invention can be prepared by known methods, for example by forming the photosensitive resin layer on the substrate and then forming a resin matte layer thereon. The plate is then exposed to active light beams through a negative film and then developed to form a relief. Typical examples of the active light beam sources are low-pressure mercury lamps, high-pressure mercury lamps, ultrahigh-pressure mercury lamps, ultraviolet fluorescent lamps, carbon arc lamps, xenon lamps, the sun light and the like. The developer can be any of those known to the art, including organic solvents, such as alcohols, acetone, benzene, toluene, chloroethane and chloroethylene; water or alkaline aqueous solvents containing, for example, sodium hydroxide, sodium carbonate, sodium phosphate, sodium tripolyphosphate, sodium borate, sodium silicate, and the like.

The photosensitive resin plate of the present invention is very suitable for flexographic printing and significantly reduces dot gain.

EXAMPLES

The present invention is illustrated by the following Examples which, however, are not to be construed as limiting the present invention to their details.

EXAMPLE 1

A resin matte composition was prepared by mixing 15 parts by weight of hydroxymethylcellulose and 95 parts by weight of distilled water and then dissolving 4 parts by weight of silica having an average particle size of 15 micrometer therein, followed by adding Cupferron (a polymerization inhibitor available from Wako Pure Chemical Industries, Ltd.).

Separately, a photosensitive resin composition, which, when cured, had a Shore A hardness of 70° and an impact resilience of 32%, was prepared by mixing 66.5 parts by weight of a copolymer (composed of 80 mol % of butadiene, 6.5 mol % of methacrylic acid, one mol % of divinylbenzene and 12.5 mol % of methyl methacrylate), 8 parts by weight of N,N-dimethylaminopropyl methacrylate, 6 parts by weight of phenoxyethoxy ethanol, 12 parts by weight of lauryl methacrylate, 5 parts by weight of trimethylolpropane triacrylate, 2 parts by weight of 2,2-dimethoxy-2-phenyl acetophenone and 0.5 parts by weight of 2,6-di-t-butyl-p-cresol, using a double roll at 60° C., followed by further mixing by a pressured double screw kneader. The composition was extruded by a double screw extruder onto an iron plate to form a photosensitive resin layer having a thickness of about 0.4 mm and a mirror smooth surface.

On the photosensitive resin composition, the previously obtained resin matte composition was coated in a thickness of 3 micrometers when dried, and dried at 70° C. for 2 minutes to obtain a photosensitive resin composition.

After the resulting resin plate was left at 20° C. for one day, a negative film was closely placed thereon in vacuum and then exposed to a 3 KW ultrahigh pressure mercury lamp for 40 minutes. It was then developed with water at 40° C. for 2 minutes, using a brush, and dried at 110° C. for 2 minutes in a drying chamber equipped with a 2 KW high pressure mercury lamp. It had an intrinsic inhibition index of 10.

The dots diameters which were actually used are shown in Table 1.

TABLE 1

| Hilight dots 65 lpi | 5% | 10% | 80% | 90% |
|---|---|---|---|---|
| Negative diameter | 98 | 139 | 196 | 120 |
| Diameter without polymerization inhibiting material | 95 | 135 | 197 | 120 |
| Diameter with polymerization inhibiting material | 89 | 122 | 202 | 120 |

All numbers shown are in microns.

If the negative dot diameter is less than 50%, the numbers show dot diameters in the cured portion, and if it is more than 50%, the numbers show dot diameter in the uncured portion.

After the resin plate was left at 20° C. for 7 days, the inhibition index was also determined to be 7.

EXAMPLE 2

The operation of Example 1 was repeated with the exception that the matte resin composition was prepared by dispersing 4 parts by weight of silica having an average article size of 15 micrometers in a solution of 15 parts by weight of hydroxy cellulose and 95 parts by weight of distilled water and then adding 19 parts by weight of sodium dibutyldithiocarbamate (a polymerization stopper) thereto.

The resulting resin plate had an intrinsic inhibition index of 16 and a with-time inhibition index of 12.

The resulting printing plate was printed using a flexographic printing machine on craft paper at 200 m/sec. No changes on the relief surface were observed after four hours and printed paper sheets had good and faithful images. The results of the printing is shown in Table 2.

COMPARATIVE EXAMPLE 1

The operation of Example 2 was repeated with the exception that sodium dibutyldithiocarbamate was not employed and the results of the printing is shown in Table 2.

COMPARATIVE EXAMPLE 2

The operation of Example 2 was repeated with the exception that 2 parts by weight of sodium dibutyldithiocarbamate was employed instead of 19 parts by weight of it and the results of the printing is shown in Table 2.

The resin plate had an intrinsic inhibition index of 2.

As is apparent from Comparative Example 2, if the intrinsic inhibition index is low, the dot diameter of the printing plate was larger and the printed images had distinct dot gain.

EXAMPLE 3

The operation of Example 1 was repeated with the exception that the matte resin composition was prepared by dispersing 4 parts by weight of silica having an average particle size of 15 micrometers in a solution of 15 parts by weight of hydroxy cellulose and 95 parts by weight of distilled water and then adding 3 parts by weight of an antioxidant available from Ciba Geigy AG as IRGANOX 1010 thereto.

The resulting resin plate had an intrinsic inhibition index of 6 and a with-time inhibition index of 6.

EXAMPLE 4

The operation of Example 1 was repeated with the exception that the matte resin composition was prepared by dispersing 4 parts by weight of silica having an average particle size of 15 micrometers in a solution of 15 parts by weight of hydroxy cellulose and 95 parts by weight of distilled water and then adding 2 parts by weight of a UV absorber available from Ciba Geigy AG as IRGANOX 1130 thereto.

The resulting resin plate had an intrinsic inhibition index of 3 and a with-time inhibition index of 2.

EXAMPLE 5

A photosensitive resin sheet, which showed a Shore A hardness of 55° and an impact resilience of 62% when cured, was prepared from crystalline 1,2-polybutadine, dioctyltetrahydrophthalate, neopentylglycol dimethacrylate and a polymerization initiator and formed into a 5 mm thick photosensitive resin sheet. A polyester sheet was adhered onto the photosensitive resin sheet as backing.

Separately, a protective polyester sheet having a surface roughness of 3.0 micron and a thickness of 100 micron was coated with a solvent type silane coupling agent (available from Toray Silicone Co., Ltd. as Toray Silicone SRX-244 including a catalyst SRX-242 AC), using a doctor blade in a thickness of 0.5 micron, and was allowed to stand for one day at room temperature.

On the silicone, a 5 wt % isopropyl alcohol/toluene solution of 100 parts by weight of medium type ethyl cellulose containing an ethoxy of 45% (available from Dow Company) and 16 parts by weight of sodium dibutyl dithiocarbamate was coated in a 1.5 micron thickness and dried.

Next, the photosensitive resin sheet having a backing layer was heated at 80° C. for 2 minutes in a hot air drier. Upon taking it out of the drier, the protective polyester film was melt-adhered on the photosensitive layer, facing the silicone surface with the photosensitive layer, and then placed on a cool surface for 10 minutes to obtain a photosensitive resin plate.

After the resulting resin plate was left at 20° C. for one day, a negative film was closely placed thereon in vacuum and then exposed to a chemical lamp for 10 minutes. It was then developed with a mixture of 25 wt % of isopropyl alcohol and 75 wt % of 1,1,1-trichloroethane for one minute, using a brush, and dried at 50° C. for 20 minutes in a drying chamber equipped with a 2 KW high pressure mercury lamp. It had an intrinsic inhibition index of 10 and a with-time inhibition index of 8.

TABLE 2

|  | 10% Hilight plate dot diameter (μ) | 10% Hilight printed paper dot diameter (μ) |
| --- | --- | --- |
| Example 2 | 117 | 182 |
| Example 5 | 128 | 172 |
| Comparative Ex. 1 | 139 | 235 |
| Comparative Ex. 2 | 138 | 221 |

What is claimed is:

1. A photosensitive resin plate for flexographic printing comprising
   a substrate,
   a photosensitive resin layer formed on said substrate, and a resin layer, following curing, having a Shore A hardness of 30° to 80° and an impact resilience of 20% or more, and
   a resin matte layer formed on said photosensitive resin layer, said resin matte layer containing a polymerization inhibiting material and said resin matte layer having an intrinsic inhibition index of 3 or more and a with-time inhibition index of 3 or more, calculated from the following equation:
   Inhibition index $=(A-B)/A \times 100$
   wherein
   A = a dot diameter (micron) when the matte layer does not contain the polymerization inhibiting material and B = a dot diameter (micron) when the matte layer contains the polymerization inhibiting material
   where the intrinsic inhibition index is defined as being determined after leaving a photosensitive resin plate for one day and the with-time inhibition index is defined as being determined after leaving a photosensitive resin plate for 7 days.

2. A photosensitive resin plate according to claim 1 wherein said resin matte layer is prepared from a resin matte composition comprising
   (a) a binder resin, and
   (b) a polymerization inhibiting material.

3. A photosensitive resin plate according to claim 2 wherein said polymerization inhibiting material is present in the resin matte composition in an amount of 0.1 to 50% by weight based on the total composition weight.

4. A photosensitive resin plate according to claim 2 wherein said binder resin (a) is selected from the group consisting of cellulose, polyvinyl alcohol polyamide and polyacrylamide.

5. A photosensitive resin plate according to claim 4 wherein the polyamide is poly(acrylamide).

6. A photosensitive resin plate according to claim 1 wherein said polymerization inhibiting material is a member selected from the group consisting of a polymerization inhibitor, a polymerization stopper, a chain transferring agent, a polymerization regulator, an antioxidant or an ultraviolet absorber.

7. A photosensitive resin plate according to claim 6 wherein said polymerization inhibiting materials are selected from the group consisting of sodium dialkyldithiocarbamate, β-naphthol, cupferrone, t-butylphenol, pentaerythrityl-tetrakis[3-(3,5-di-t-butyl-4-hydroxyphenyl) propionate] and 2,2-thiodiethylenebis-[3-(3,5-di-t-butyl-4-hydroxyphenyl) propionate].

* * * * *